(12) United States Patent
Ericks n et al.

(10) Patent No.: US 6,980,429 B2
(45) Date of Patent: Dec. 27, 2005

(54) DEVICE RETENTION APPARATUS LOCKING ASSEMBLY

(75) Inventors: Vern n D. Ericks n, Dakota Dunes, SD (US); David R. Davis, Jefferson, SD (US)

(73) Assignee: Gateway Inc., Irvine, CA (US)

( * ) Notice: Subject to any disclaimer, the term of this patent is extended or adjusted under 35 U.S.C. 154(b) by 181 days.

(21) Appl. No.: 10/645,423

(22) Filed: Aug. 21, 2003

(65) Prior Publication Data

US 2004/0037049 A1 Feb. 26, 2004

Related U.S. Application Data

(63) Continuation-in-part of application No. 10/028,229, filed on Oct. 22, 2001, now Pat. No. 6,671,180, which is a continuation-in-part of application No. 09/583,112, filed on May 25, 2000, now Pat. No. 6,456,489.

(51) Int. Cl.[7] ............................................... G06F 1/16
(52) U.S. Cl. .................... 361/685; 248/224.8; 361/333
(58) Field of Search ............................... 361/683–686, 361/724–727; 312/223.1, 223.2, 333; 439/152, 439/155, 157, 159, 483, 484; 248/220.31, 248/224.8, 500, 581

(56) References Cited

U.S. PATENT DOCUMENTS 4,179,718 A 12/1979 Rolph
4,688,131 A * 8/1987 Noda et al. .................. 361/685
5,535,093 A * 7/1996 Noguchi et al. ............. 361/686
5,682,291 A * 10/1997 Jeffries et al. ............... 361/685
5,683,159 A * 11/1997 Johnson .................... 312/223.2
5,734,557 A * 3/1998 McAnally et al. ........... 361/727
5,801,920 A * 9/1998 Lee .............................. 361/685
5,921,644 A * 7/1999 Brunel et al. ............. 312/223.2
6,025,987 A * 2/2000 Allirot et al. ................ 361/685
6,293,636 B1 * 9/2001 Le et al. ................... 312/223.2
6,297,952 B1 * 10/2001 Liu et al. ..................... 361/685
6,304,457 B1 * 10/2001 Liu et al. ..................... 361/685
6,337,793 B1 * 1/2002 Vier et al. ................... 361/683
6,343,009 B1 * 1/2002 Liu et al. ..................... 361/684
6,388,868 B1 5/2002 Leccia et al.
6,392,874 B1 5/2002 Gan
6,619,766 B1 * 9/2003 Mansueto ................. 312/223.1

* cited by examiner

Primary Examiner—Lisa Lea-Edmonds
(74) Attorney, Agent, or Firm—Sunak K. Lee; Suiter West Swantz

(57) ABSTRACT

The present invention is directed to a device retention apparatus for an information handling system. The device retention apparatus includes a housing for mounting an information handling system device and a retaining portion located on the housing, the retaining portion for engaging the information handling system device when placed in the housing. A selection mechanism for securing the information handling system device to the housing is slideably connected to the housing. A locking ramp portion is included on a door assembly of the information handling system for engaging the selection mechanism.

23 Claims, 15 Drawing Sheets

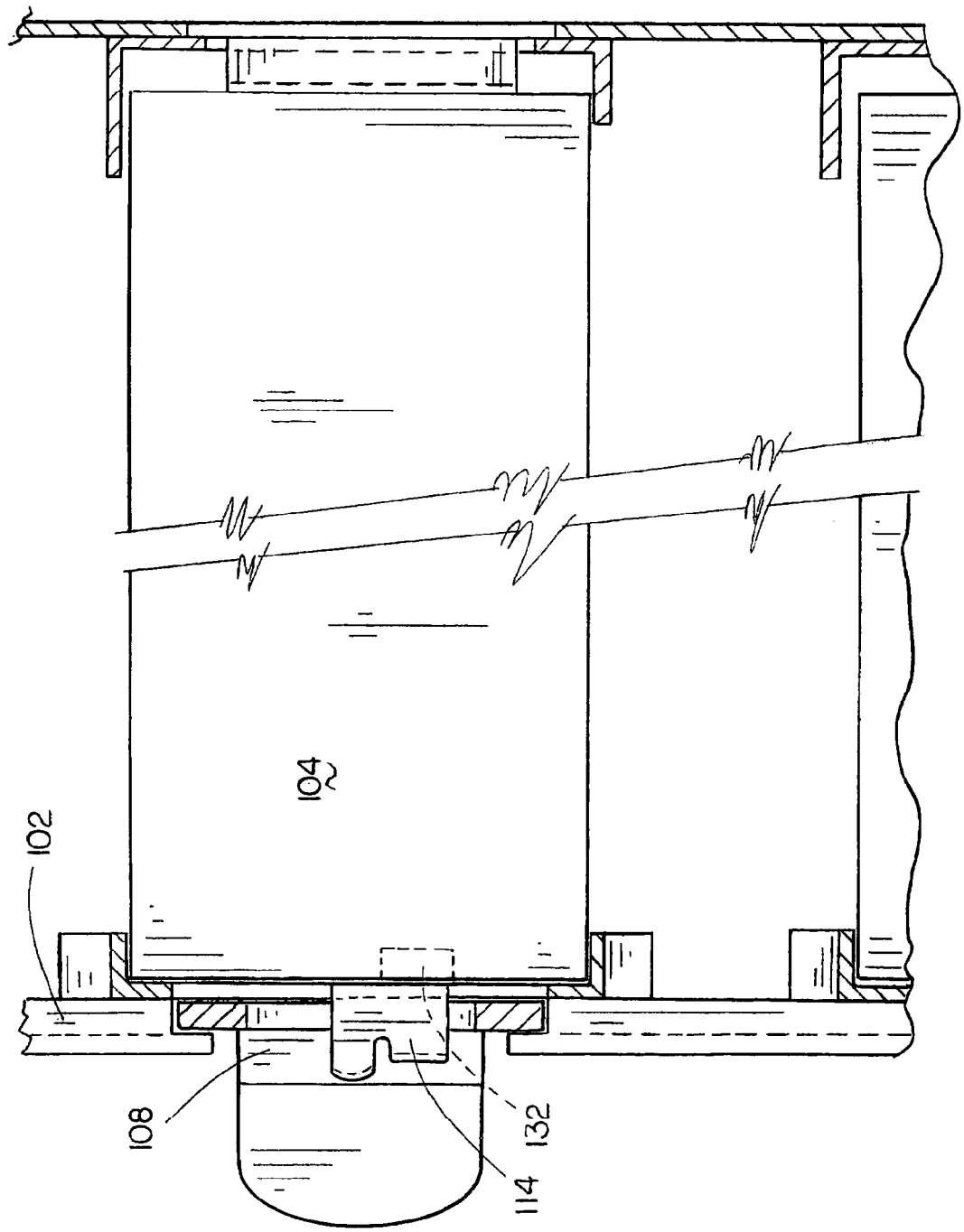

DEVICE RETENTION APPARATUS LOCKING ASSEMBLY

CROSS-REFERENCE TO RELATED APPLICATIONS

The present application is a continuation-in-part of U.S. patent application Ser. No. 10/028,229, filed Oct. 22, 2001 now U.S. Pat. No. 6,671,180, which is a continuation-in-part of U.S. patent application Ser. No. 09/583,112, filed May 25, 2000, now U.S. Pat. No. 6,456,489, issued Sep. 24, 2002. U.S. patent applications Ser. Nos. 09/583,112 and 10/028, 229 and U.S. Pat. No. 6,456,489 are herein incorporated by reference in their entirety.

FIELD OF THE INVENTION

The present invention generally relates to the field of mounting devices for information handling system devices, and particularly to a device retention apparatus.

BACKGROUND OF THE INVENTION

The manufacture and assembly of information handling systems has become increasingly competitive. Manufacturers continually strive to improve the design and features of information handling systems yet still offer competitive prices. One such area of improvement is in the mounting of devices in an information handling system. An information handling system, such as a typical desktop system, tower, server, or the like, may include information handling system devices, such as disk drives, compact disc read-only memory (CD-ROM) drives, digital video disc (DVD) players, floppy drives, and the like. These devices are typically added to increase the functionality of the information handling system as may be desired by a user. However, the installation of these devices in the information handling system may be very labor intensive.

For instance, the installation of a hard disk drive in an information handling system may involve the use of screws, typically four, to attach the drive to a housing included in the system. Typically, these screws are small, making them difficult to manipulate and install. Additionally, because of their small size, the screws may be dropped by an assembler, possibly causing damage to the information handling system due to shorts, lodging in moving parts, and the like. Moreover, information handling systems become increasingly smaller with new advances in integrating parts, miniaturizing components, and the like. With this smaller size comes a corresponding lack of space, making it even more difficult to mount devices in an information handling system.

Further, the upgrade and repair of information handling system devices has become increasingly complicated. For example, a user may wish to add a new device such as a larger hard drive, a digital video disc (DVD) player, and the like to an information handling system; however, the removal of an old device may require the user to remove a plurality of screws to release the old device and the installation of additional screws to install the new device. This may require a significant amount of time and result in a loss of components, such as the screws and other attaching hardware.

Therefore, it would be desirable to provide an improved device retention apparatus.

SUMMARY OF THE INVENTION

Accordingly, the present invention is directed to a device retention apparatus. In one aspect of the present invention, a device retention apparatus includes a housing, a retaining portion, and a selection mechanism. The housing includes a first side, a second side, and a third side, wherein the second side is oriented generally opposing the first side, and the third side is oriented generally perpendicular to the first side and the second side. The retaining portion is included on the housing for engaging an information handling system device when placed in the housing. The selection mechanism is slideably connected to the housing so as to be capable of moving between a first position and a second position. As the selection mechanism is moved from the first position to the second position, the selection mechanism contacts the retaining portion, thereby securing the information handling system device to the housing, the information handling system device engaging the first side of the housing, the second side of the housing, and the third side of the housing.

In a further aspect of the present invention, a device retention apparatus includes a housing and an information handling system device. The housing includes a first housing side, a second housing side, and a third housing side. The second housing side is oriented generally opposing the first housing side, and the third housing side oriented is generally perpendicular to the first housing side and the second housing side. The housing includes a first housing securing segment on the first side, a second housing securing segment on the second side, and a third housing securing segment on the third side. The information handling system device includes a first device side, a second device side, and a third device side. The information handling system device further includes a first device securing segment on the first side, a second device securing segment on the second side, and a third device securing segment on the third side. The information handling system device is installed in the housing by contacting the first housing securing segment with the first device securing segment and rotating the device so that the second housing securing segment contacts the second device securing segment and the third housing securing segment contacts the third device securing segment, thereby securing the information handling system device to the housing.

In another aspect of the present invention, a method of retaining an electronic device in a housing includes engaging a first device side of an information handling system device against a first housing side of a housing for retaining an information handling system device. The housing includes the first housing side, a second housing side, and a third housing side, wherein the second housing side is oriented generally opposing the first housing side, and the third housing side is oriented generally perpendicular to the first housing side and the second housing side. The information handling system device includes a first device side, a second device side, and a third device side. The information handling system device is rotated about the portion of the information handling system device engaged with the housing, so that the information handling system device is secured to the first housing side, second housing side, and third housing side.

It is to be understood that both the foregoing general description and the following detailed description are exemplary and explanatory only and are not necessarily restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 3B is an end view of the device retention apparatus illustrated in FIG. 3A, wherein the selection mechanism forces the retaining portion into the information handling system device, thereby securing the device to a housing;

DETAILED DESCRIPTION OF THE INVENTION

Reference will now be made in detail to the presently preferred embodiments of the invention, examples of which are illustrated in the accompanying drawings.

Referring generally now to FIGS. 1 through 10B, a device retention apparatus in accordance with exemplary embodiments of the present invention is described. Information handling systems such as desktop computers, tower systems, convergence systems, servers, and the like may be complicated to manufacture and update. To install and remove information handling system devices, such as compact disc read-only memory (CD-ROM) drives, digital versatile disc (DVD) drives, disk drives such as hard disk drives, floppy disk drives, floppy/optical disk drives, and the like, may require time consuming effort.

For example, if a user wishes to update a device, such as installing a hard disk drive having a higher storage capacity, the user may have to engage in a time consuming process performed in the limited confines of an information handling system chassis. The present invention addresses this problem by providing a mounting assembly that is capable of easy operation by a user, permitting faster installation and removal of information handling system devices in a more secure manner.

Figure 1:
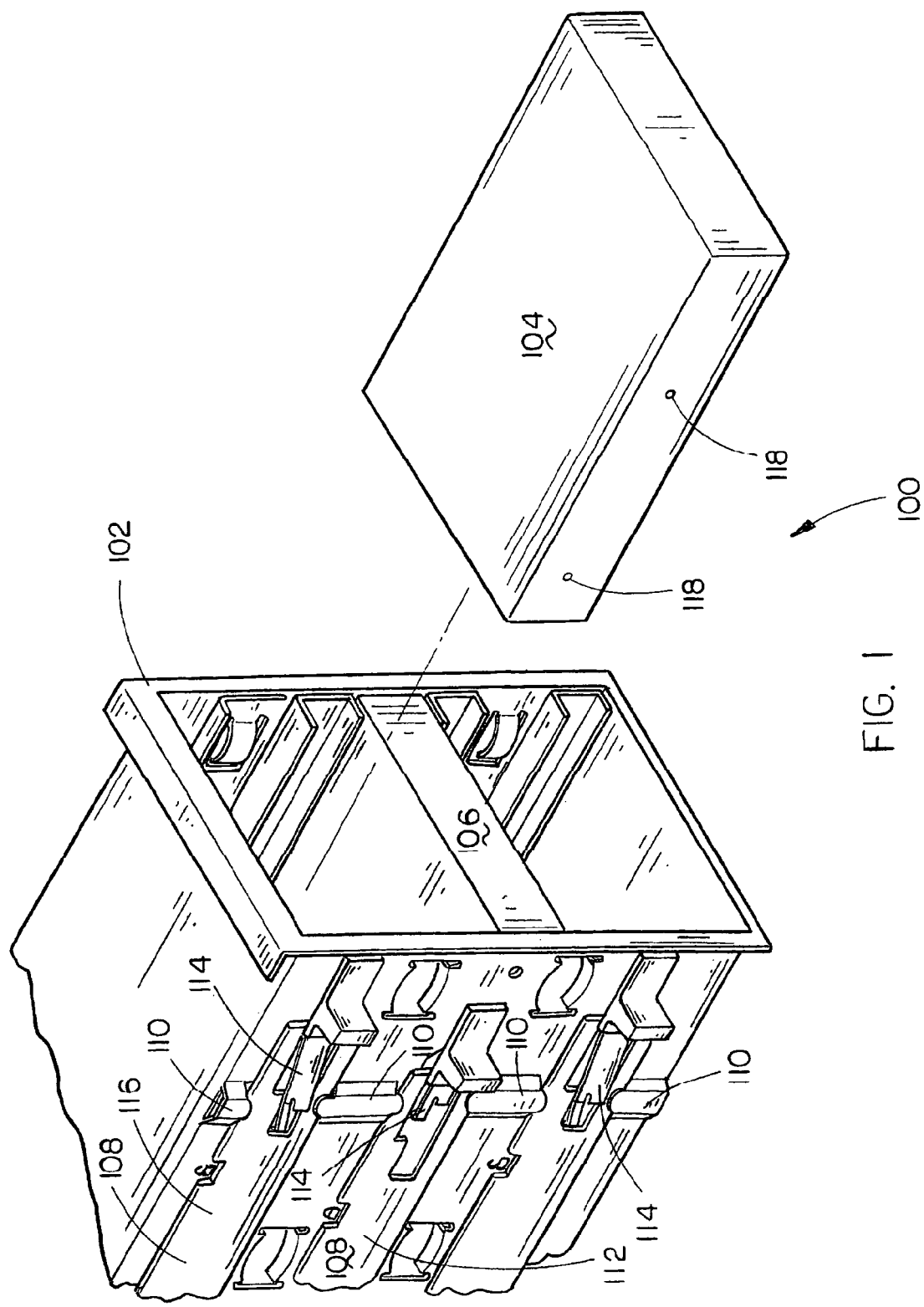
FIG. 1 is an isometric view illustrating a device retention apparatus in accordance with an exemplary embodiment of the present invention, wherein the device retention apparatus is utilized to secure and release an information handling system device.

Referring now to FIG. 1, a device retention assembly 100 in accordance with an exemplary embodiment of the present invention is described. The device retention assembly 100 may include a housing 102 for mounting information handling system devices 104 and 106. A selection mechanism 108 on the housing 102 is capable of slideable movement, which may be achieved through the use of brackets 110 which secure the selection mechanism 108 to the housing 102. The brackets 110 permit the selection mechanism 108 to slide to a first position 112, wherein the selection mechanism 108 contacts a retaining portion 114, securing the device 106 to the housing 102. The brackets 110 also permit the selection mechanism 108 to slide to a second position 116, wherein the selection mechanism 108 contacts the retaining portion 114 so as to permit removal of the device 104 from the housing 102.

Preferably, the retaining portion 114 is formed for engaging mounting holes 118 on the information handling system devices 104 and 106. Although the use of brackets 110 for sliding the selection mechanism 108 is shown, it will be apparent to those of ordinary skill in the art that a variety of methods and apparatus may be selected to permit movement of the selection mechanism 108 without departing from the scope and intent of the present invention.

Figure 2B:
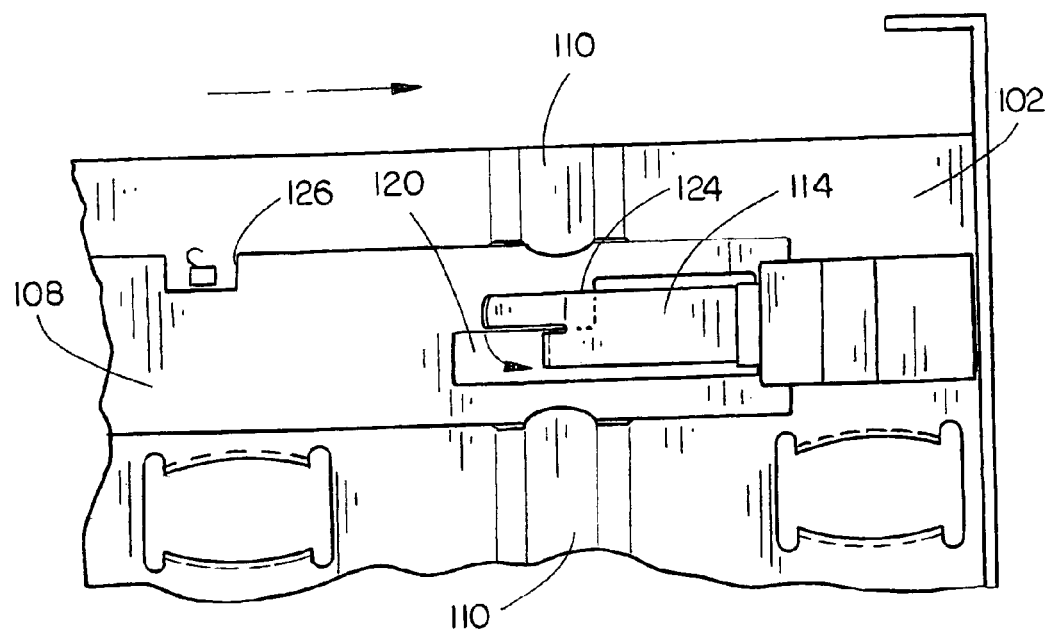
FIG. 2B is a side view of the device retention apparatus illustrated in FIG. 1, wherein the device retention apparatus is operated to release the information handling system device.
Figure 2A:
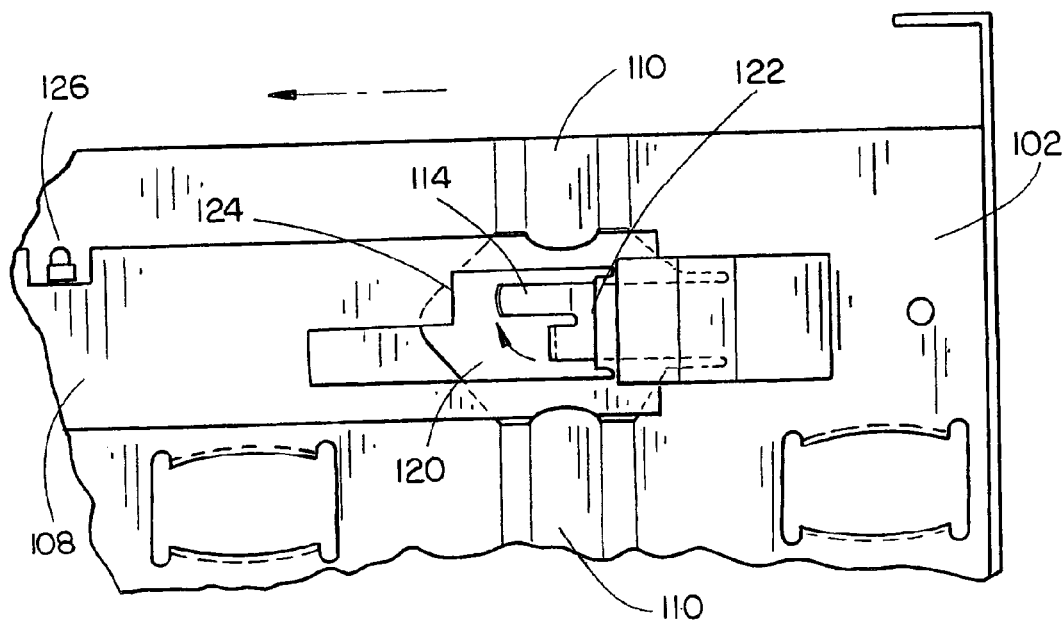
FIG. 2A is a side view of the device retention apparatus illustrated in FIG. 1, wherein the device retention apparatus is operated to secure the information handling system device.

Referring now to FIG. 2A, the device retention assembly 100 is operated to secure the information handling system device 104 (FIG. 1). The device retention assembly 100 includes the selection mechanism 108 on the housing 102. The selection mechanism 108 is capable of slideable movement along the housing 102 through the use of brackets 110. To secure the information handling system device 104 (FIG. 1) in the housing 102, the selection mechanism 108 is moved, causing the selection mechanism 108 to engage the retaining portion 114, forcing the retaining portion 114 toward the interior of the housing 102. In this way, the retaining portion 114 engages the information handling system device 104 (FIG. 1) located in the housing 102, securing the information handling system device 104 (FIG. 1) to the housing 102. It may be preferable to include an aperture 120 in the selection mechanism 108 to permit movement of the retaining portion 114 through the aperture 120, increasing the range of motion of the retaining portion 114. A first edge portion 122 of the aperture 120 may be utilized to contact the retaining portion 114 and move the retaining portion 114 into a securing position.

It may also be preferable to include a viewing portion 126 as part of the selection mechanism 108 to indicate the status of the selection mechanism 108. For example, when the selection mechanism 108 is in a secured state, as shown in FIG. 2A, the viewing portion 126 of the selection mechanism 108 may be used to view a securing indication on the housing 102. The securing indication may be a pictorial representation of a lock such as the outline of a padlock, a text indication such as a word or phrase, or the like for indicating the status of the selection mechanism 108 as contemplated by those of ordinary skill in the art. Thus, a user may have an additional way of determining the state of the selection mechanism 108, including verification that the selection mechanism 108 is in a locked state.

Referring now to FIG. 2B, the device retention assembly 100 is operated to release a device. The device retention assembly 100 includes the selection mechanism 108 slideably mounted to the housing 102 with the use of brackets 110. To release the information handling system device 104 (FIG. 1) from the housing 102, the selection mechanism 108 is moved to a second position for disengaging the retaining portion 114 from the information handling system device 104 (FIG. 1), permitting removal of the information handling system device 104 (FIG. 1) from the housing 102. The aperture 120 includes a second edge portion 124, utilized to contact the retaining portion 114 and disengage the retaining portion 114 from the information handling system device 104 (FIG. 1). For example, the second edge portion 124 of the aperture 120 may lift the retaining portion 114 from the mounting hole 118 (FIG. 1) on the information handling system device 104 (FIG. 1), permitting removal of the device 104 (FIG. 1) from the housing 102. In this way, the information handling system device 104 (FIG. 1) may be removed from the housing 102 in an improved manner, without the necessity of tools and other labor and time intensive processes.

Figure 3C:
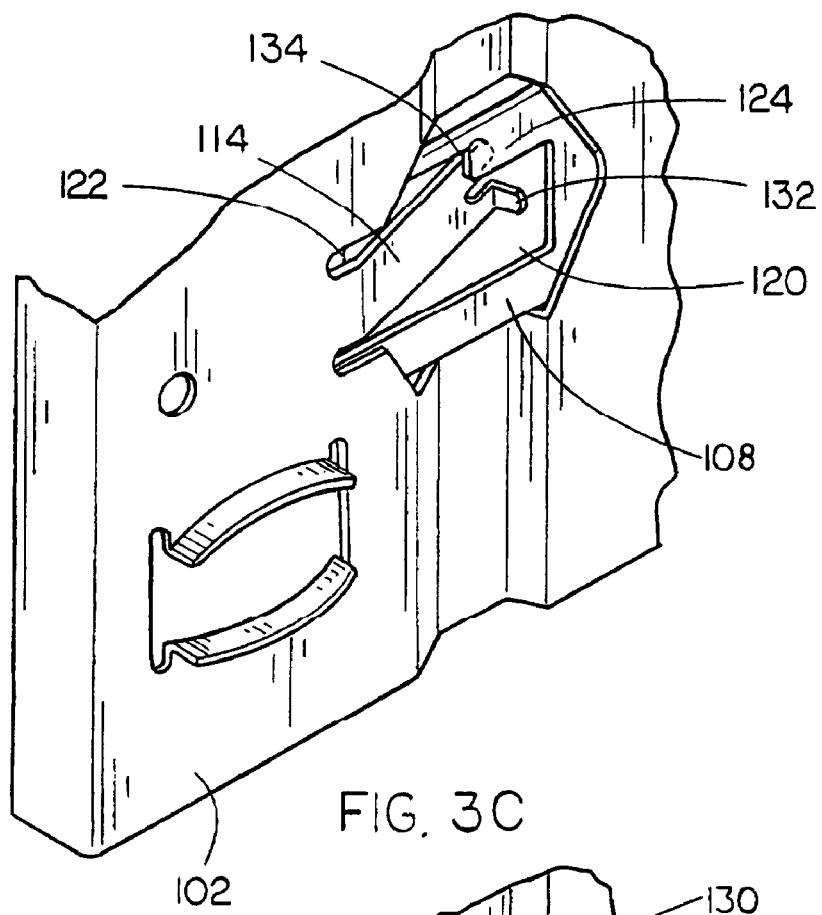
FIG. 3C is an enlarged isometric view of the device retention apparatus illustrated in FIG. 1, wherein the selection mechanism is utilized to move the retaining portion to release the information handling system device.
Figure 3A:
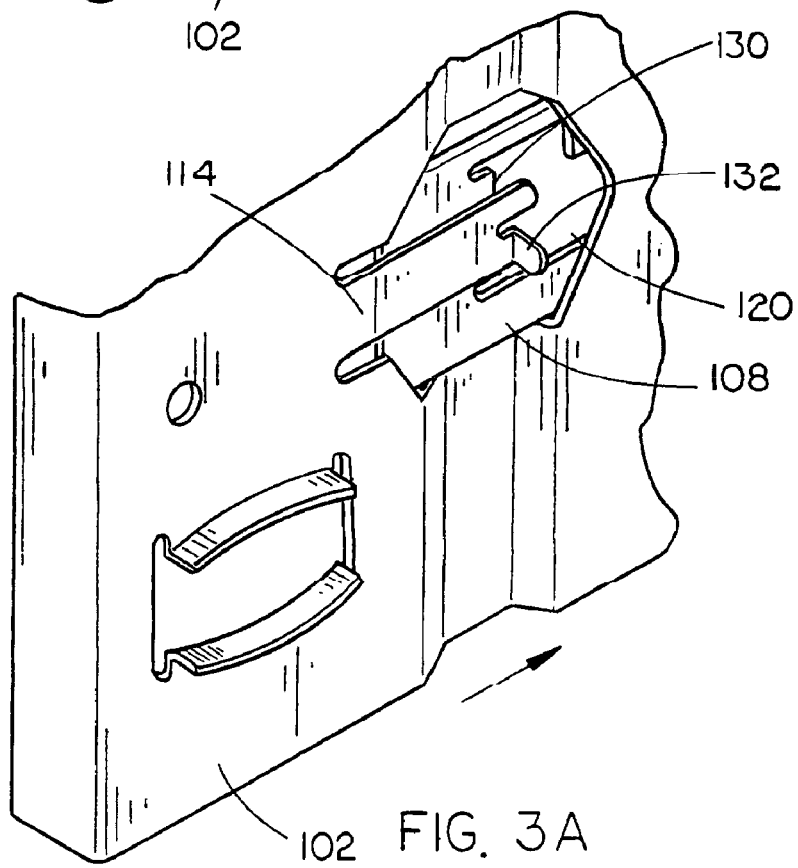
FIG. 3A is an enlarged isometric view of the device retention apparatus illustrated in FIG. 1, wherein a selection mechanism is utilized to move a retaining portion to a securing position.

Referring now to FIGS. 3A and 3B, the device retaining assembly 100 utilizes the selection mechanism 108 to move the retaining portion 114 to a securing position. Preferably, the housing 102 includes the retaining portion 114 formed as an integral part thereof. In this way, the retaining portion 114 and the housing 102 may be stamped from one piece of metal, saving time and expense in manufacturing and assembly. The selection mechanism 108 on the housing 102 is capable of sliding between a first position 112 (FIG. 1) and a second position 116 (FIG. 1), as described in FIGS. 2A and 2B. The aperture 120 on the selection mechanism 108 enables the retaining portion 114 to operate through an increased range of motion, as described in FIGS. 2A and 2B.

As the selection mechanism 108 is moved to the first position 112 (FIG. 1) for securing the information handling system device 104 to the housing 102, a second edge portion 130 of the aperture 120 contacts the retaining portion 114, forcing the retaining portion 114 toward the interior of the housing 102, as shown in FIG. 3B. A retaining tab 132 of the retaining portion 114 engages the mounting hole 118 of the information handling system device 104 to secure the information handling system device 104 to the housing 102. By utilizing the selection mechanism 108 to move and secure the retaining portion 114, the retaining portion 114 need not be made of sprung steel, resulting in cost savings as cheaper grades of material may be utilized, such as metal, plastic, composites, and the like.

Referring now to FIG. 3C, the device retention assembly 100 utilizes the selection mechanism 108 to move a retaining portion 114 to release the information handling system device 104 (FIG. 3B). The housing 102 includes the retaining portion 114 formed as an integral part thereof. The selection mechanism 108 is included on the housing 102 and is capable of sliding between a first position 112 (FIG. 1) and a second position 116 (FIG. 1), as shown in FIGS. 2A and 2B. As the selection mechanism 108 is moved to the second position 116 (FIG. 1) to release the information handling system device 104 (FIG. 3B) from the housing 102, the first edge portion 126 of the aperture 120 contacts the retaining portion 114, forcing the retaining portion 114 outward from the interior of the housing 102. The aperture 120 of the selection mechanism 108 enables the retaining portion 114 to operate through an increased range of motion. Thus, a retaining tab 132 of the retaining portion 114 may be moved a sufficient distance to prevent interference with the insertion and removal of a device 104 (FIG. 3B) from the housing 102.

Preferably, a lifting tab 134 is included on the selection mechanism 108 for contacting the second edge portion 128 and increasing the reliability of releasing the retaining tab 132. For example, the lifting tab 134 may be formed to extend generally outward from the housing 102 and the information handling system device 104 (FIG. 3B). When the selection mechanism 108 is operated to release the information handling system device 104 (FIG. 3B), the lifting tab 134 may aid in releasing the retaining tab 132 from the information handling system device 104 (FIG. 3B). Those of ordinary skill in the art will appreciate that the retaining portion 114 may be made from a material that does not have spring-like characteristics; instead the retaining portion may be operated through the movement of the selection mechanism 108.

Figure 4:
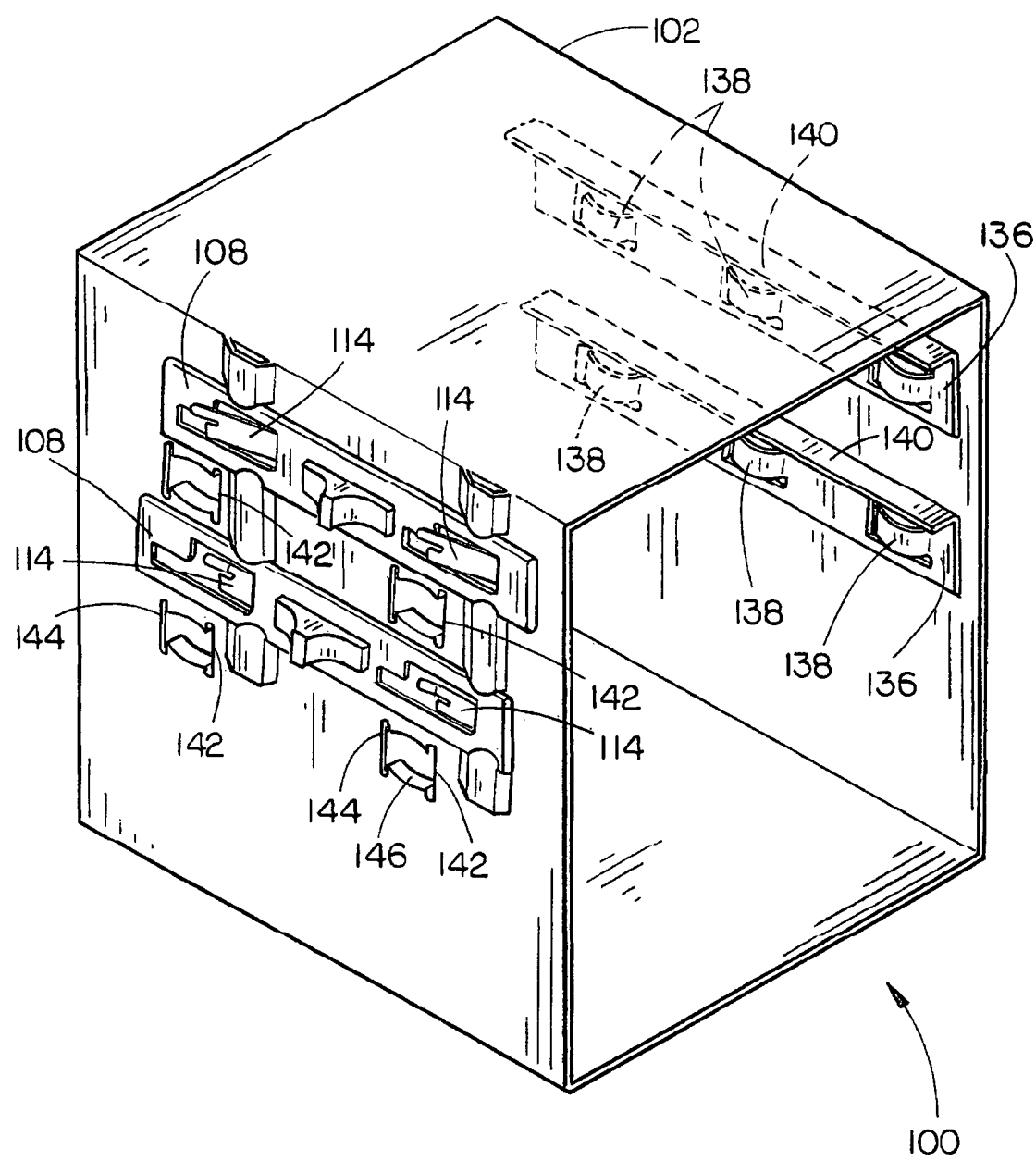
FIG. 4 is an isometric view illustrating a device retention apparatus in accordance with an exemplary embodiment of the present invention, wherein the device retention apparatus includes a biasing mechanism for biasing a device toward a selection mechanism.

Referring now to FIG. 4, a device retention assembly 100 in accordance with a further exemplary embodiment of the present invention is described. The device retention assembly 100 includes a biasing mechanism 136 for biasing an information handling system device 104 (FIG. 1) toward a selection mechanism 108. The device retention assembly 100 includes a housing 102 for mounting information handling system devices 104 and 106 (FIG. 1). A selection mechanism 108 is included on one side of the housing 102. The biasing mechanism 136 includes springs 138 or the like for biasing the information handling system device 104 (FIG. 1) toward the selection mechanism 108 when it is inserted into the housing 102. In this way, the information handling system device 104 (FIG. 1) may be further secured, preventing rattling and other unwanted movement and allowing for a more secure connection between the mounting holes 118 (FIG. 1) and a retaining portion 114.

A guide 142 may be provided for enabling the information handling system device 104 (FIG. 1) to slide along the housing 102 in an improved manner. For example, the biasing mechanism 136 may include a rail 140 for sliding an information handling system device 104 (FIG. 1) thereupon. The guide 142 may be formed as an integral part of the housing 102. For instance, the guide 142 may be a stamped portion of the housing 102, permitting a bottom surface of the information handling system device 104 (FIG. 1) to slide along an upper portion 144 of the stamped guide 142 and the rail 140. It may also be preferable to include a lower portion 146 to secure a top surface of the information handling system device 104 (FIG. 1) and prevent unwanted movement when the information handling system device 104 (FIG. 1) is inserted in the housing 102.

Figure 5:
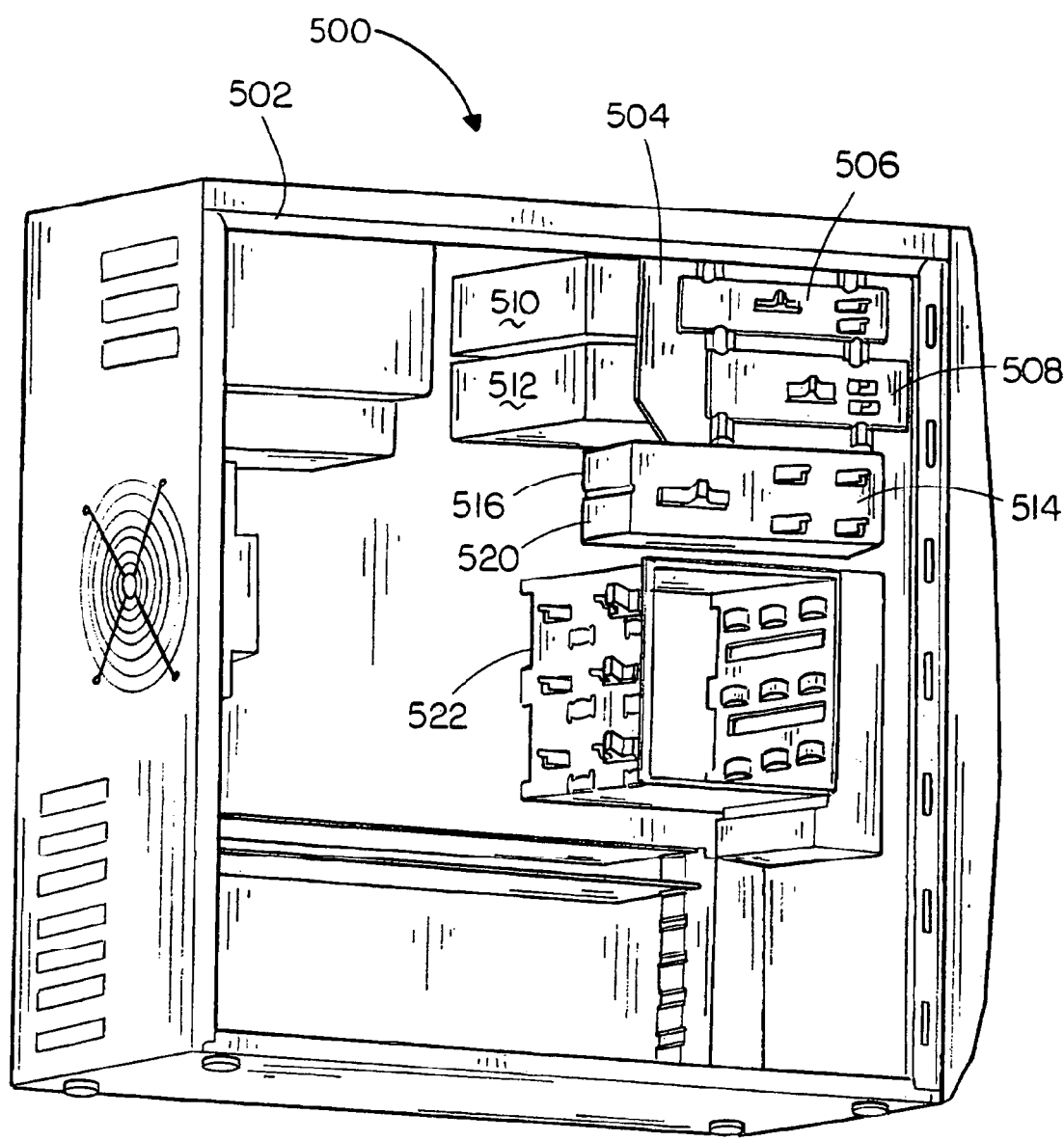
FIG. 5 is an isometric view illustrating an information handling system incorporating a device retention apparatus in accordance with an exemplary embodiment of the present invention.

A device retention apparatus may be oriented in a variety of ways and include a variety of sizes without departing from the scope and spirit of the present invention. For example, as shown in FIG. 5, an information handling system 500 formed as a tower unit is shown. The information handling system 500 includes a chassis 502 for housing various components and devices, protecting the components and devices from environmental and other potentially harmful influences. A first device retention assembly 504 includes a first selection mechanism 506 and a second selection mechanism 508 for securing information handling system devices 510 and 512. The first device retention apparatus 504 is oriented in the chassis 502 to enable the insertion and removal of the information handling system devices 510 and 512 from the front of the chassis 502. This orientation may be preferable for removable media devices, such as compact disc read-only memory (CD-ROM) drives, digital video disc (DVD) players, floppy disk drives, and the like, enabling a user to access the information handling system devices 510 and 512 when secured to the device retention assembly 504. A selection mechanism 514 may also be formed to secure a plurality of devices 516 and 520 to the device retention assembly 504.

Additionally, a device retention assembly 522 may be oriented in a case 502 to secure traditional internal components that typically do not need to be frequently accessed by a user, such as hard drives and the like. For example, the device retention apparatus 522 may be oriented to secure devices in an internal portion of the chassis 502 which may be accessed by a door on the side of the chassis 502. Those of ordinary skill in the art will appreciate that information handling system devices having a wide variety of sizes and shapes may be secured by the device retention assembly 522 without departing from the scope and intent of the present invention, including 5¼ inch disk drives, 3½ inch disk drives, and the like.

Figure 6A:
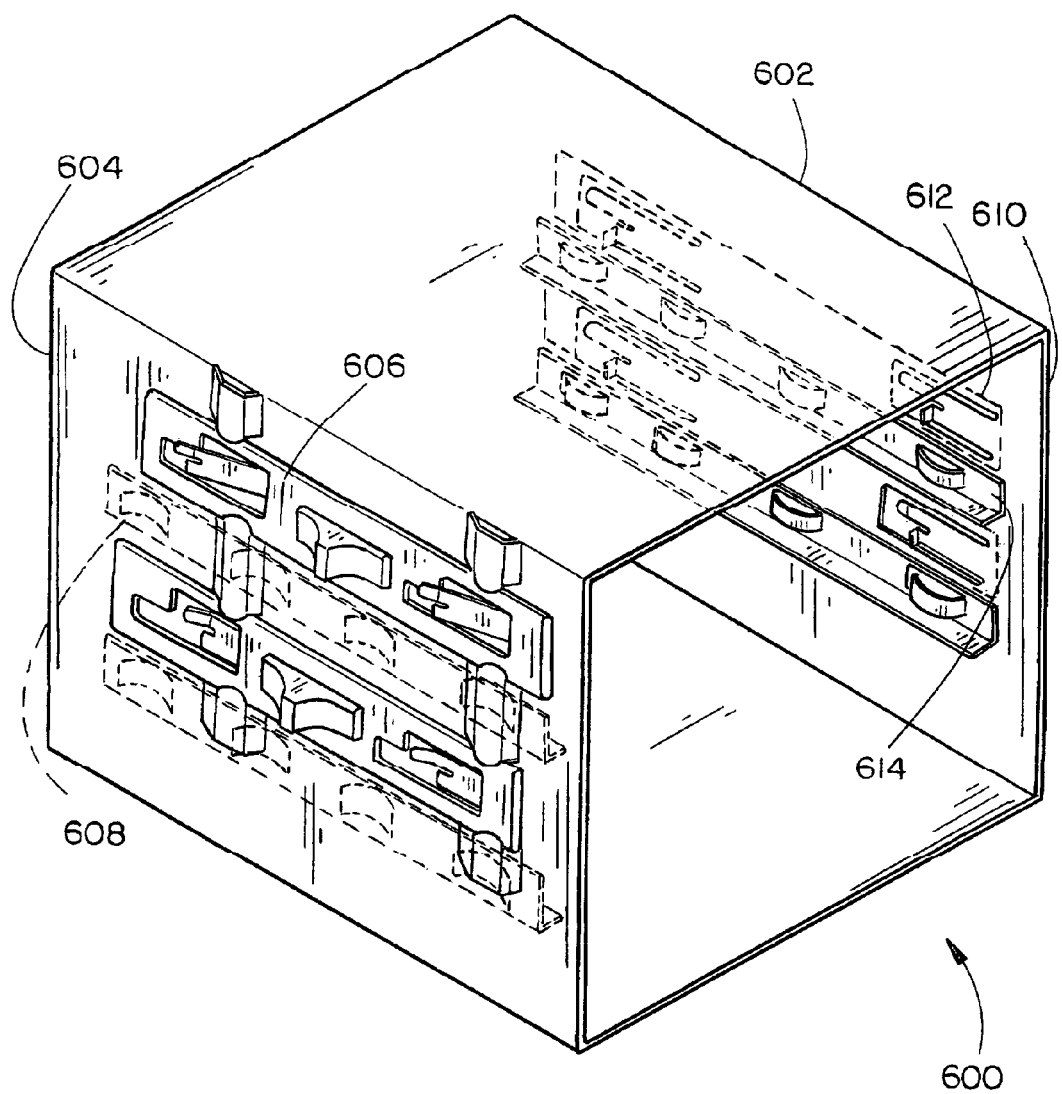
FIGS. 6A and 6B are isometric views illustrating a device retention apparatus in accordance with an exemplary embodiment of the present invention, wherein a plurality of selection mechanisms and biasing mechanisms are utilized.
Figure 6B:
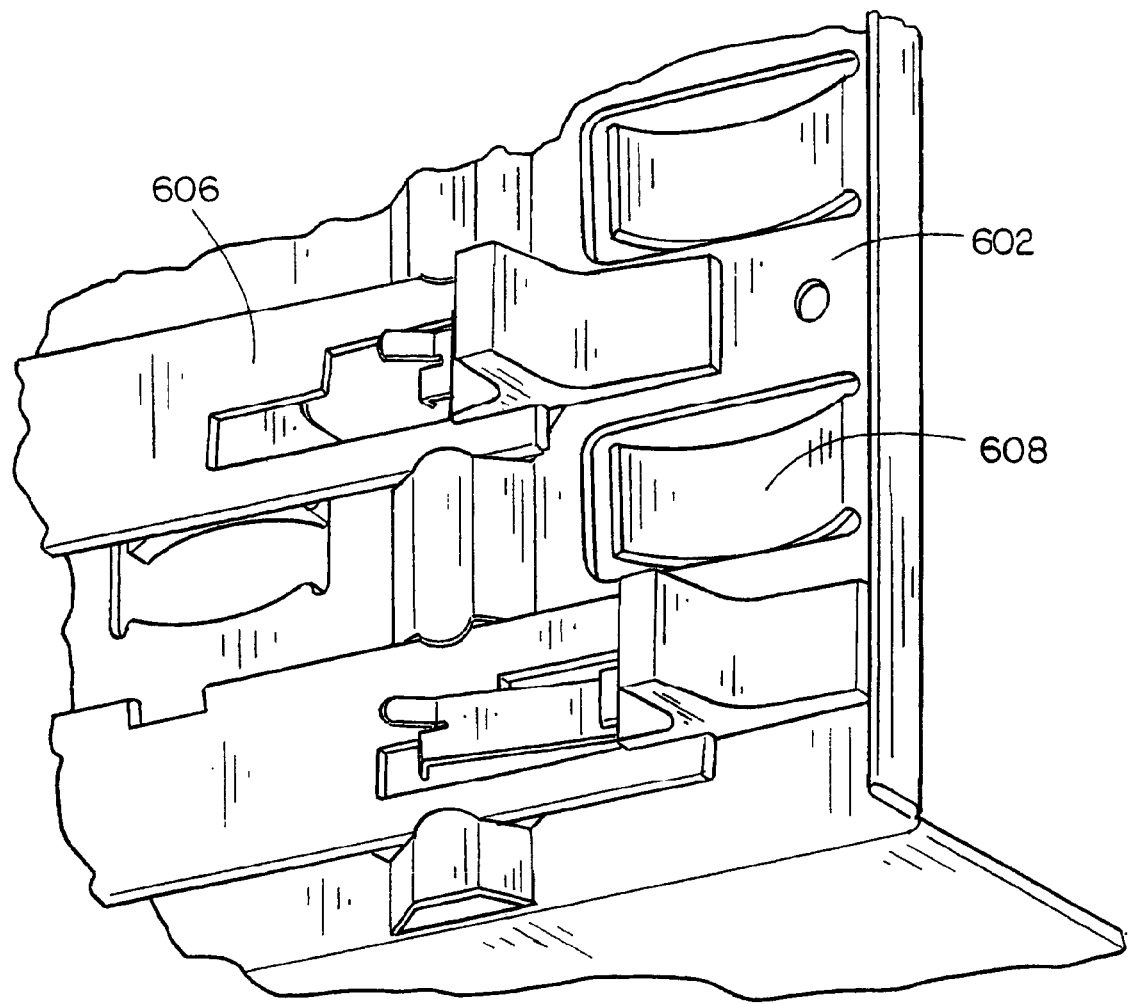

Referring now to FIGS. 6A and 6B, a device retention assembly 600 in accordance with another exemplary embodiment of the present invention is described. The device retention assembly 600 includes a housing 602 for securing information handling system devices 104 and 106 (FIG. 1). A first side 604 of the housing 602 includes a selection mechanism 606 and a biasing mechanism 608. A second side 610 of the housing 602 includes a selection mechanism 612 and a biasing mechanism 614. In this manner, the device retention assembly 600 is capable of securing information handling system devices 104 and 106 (FIG. 1) on two opposing sides, further securing the information handling system devices 104 and 106 (FIG. 1). Those of ordinary skill in the art will appreciate that the provision of a plurality of biasing mechanisms 608 and 614 may further prevent unwanted movement of the information handling system devices 104 and 106 (FIG. 1) within the housing 602.

Figure 7:
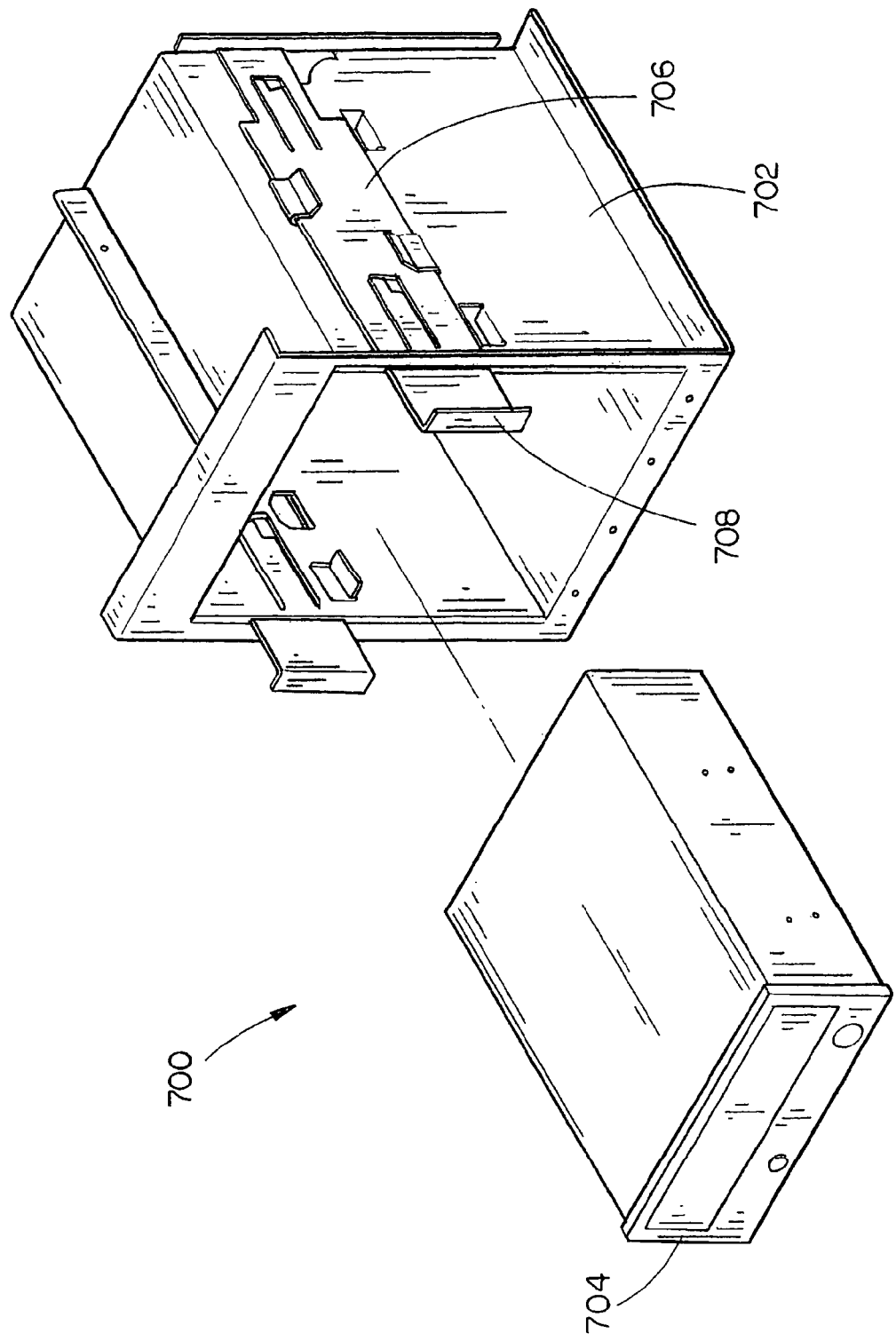
FIG. 7 is an isometric view illustrating a device retention apparatus in accordance with an exemplary embodiment of the present invention, wherein the device retention apparatus includes a selection mechanism formed to extend outward from a front opening of a housing.

Referring now to FIG. 7, a device retention assembly 700 in accordance with a still further exemplary embodiment of the present invention is described. The device retention assembly 700 includes a housing 702 for securing an information handling system device 704. The device retention assembly 700 includes a selection mechanism 706 located on the housing 702. Preferably, the selection mechanism 706 is formed to extend outward from the housing 702, permitting operation of the selection mechanism 706 from the front portion of the housing 702. For example, a handle 708 may be located on the front edge of the selection mechanism 706, enabling a user to grasp the handle 708 for alternately securing and releasing the selection mechanism 706 as previously described. Thus, the device retention assembly 700 may be operated without requiring access to the information handling system device 704 from the side of the housing, permitting operation of the device retention assembly 700 in limited space environments.

Figure 8A:
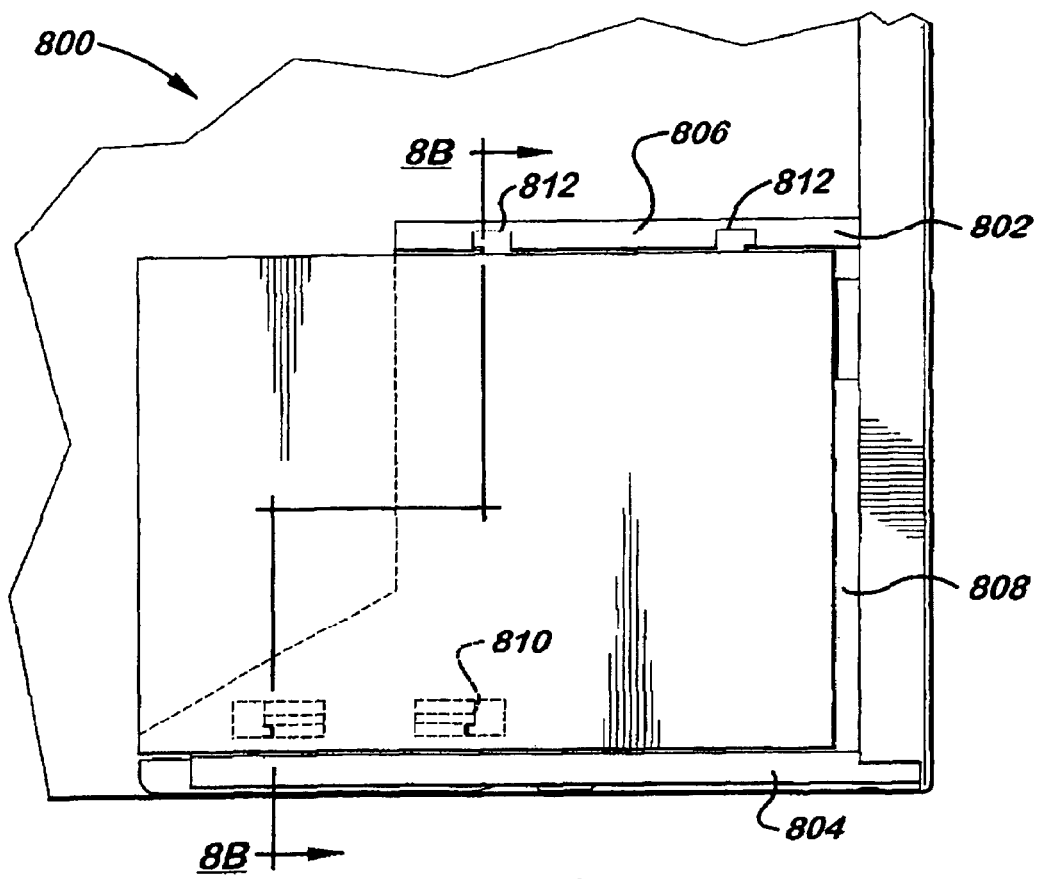
FIG. 8A is a plan view of a device retention apparatus in accordance with an exemplary embodiment of the present invention, wherein a housing includes securing segments on three sides.

Referring now to FIG. 8A, a device retention assembly 800 in accordance with a further embodiment of the present invention is described. The device retention assembly 800 is secured to three sides of a housing 802 to hold an information handling system device 814 securely in place within the housing 802. The housing 802 includes a first side 804, a second side 806, and a third side 808. The first side 804 and the second side 806 generally oppose each other, and the third side 808 is oriented generally perpendicular to the first side 804 and the second side 806. In this example, the first side 804 and the second side 806 are generally longitudinal sides of the housing 802, while the third side 808 is configured for use as the top and/or bottom of the housing 802.

Securing segments 810 and 812 are provided to secure the information handling system device 814 to the housing 802. The first side 804, the second side 806, and the third side 808 each include a securing segment for holding the information handling system device 814 securely in place within the housing 802. A securing segment may be configured in a variety of ways as contemplated by those of ordinary skill in the art without departing from the spirit and scope of the present invention. For example, the third securing segment 810, configured as a tab for engaging a corresponding receptacle or the like on the information handling system device 814, may secure a third side of the information handling system device 814 to the third side 808 of the housing 802. The second securing segment 812 may be configured as a receptacle for receiving tabs included on a second side of an information handling system device 814. It should be apparent that securing segments may be mounted in a variety of ways as contemplated by those of ordinary skill in the art, including tabs on the information handling system device 814 and/or housing 802, a retaining portion in conjunction with a selection mechanism as described earlier, and the like.

By providing securing portions on three of the four largest sides, based on an area or a dimension of a side, the device may be protected against jarring and rattling during shipping, greatly increasing the durability of an information handling system including the information handling system device and making the information handling system less prone to damage, enabling manufacturers of the information handling system to offer the products for less cost.

Figure 8B:
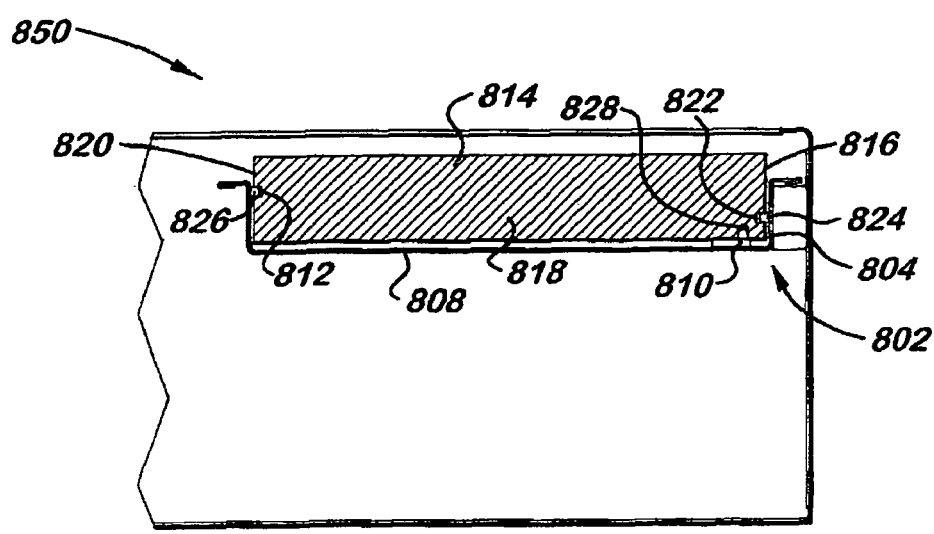
FIG. 8B is an end view of the device retention apparatus illustrated in FIG. 8A, wherein an information handling system device is retained in a housing.

Referring now to FIG. 8B, a device retention assembly 850 in accordance with an exemplary embodiment of the present invention includes an information handling system device 814, securely mounted in a housing 802. The information handling system device 814 such as a hard drive, optical media drive, floppy drive, electronic data storage device, and the like may be configured to include a first side 816, a second side 820, and a third side 818. Like the housing 802 described previously, the first side 816 and the second side 820 may include longitudinal sides of the information handling system device 814, while the third side

818 may include the top and/or bottom of the information handling system device 814. The three sides 816, 818, and 820 may include the largest sides of the device 814, as defined by area, a dimension such as length or width, and the like.

The information handling system device 814 includes securing segments to provide secure attachment of the information handling system device 814 to the housing 802. A first securing segment 822 of the information handling system device 814 is configured as a receptacle suitable for receiving a first securing segment 824, configured as a tab and included on a first side 804 of the housing 802.

Additionally, a third securing segment 810 on a third side 808 of the housing 802 is configured as a tab for insertion into a receptacle, in this instance a third securing segment 828 of the information handling system device 814. The third securing segment 810 of the housing 802 is positioned on a side nearer the first side 804 of the housing 802, the side divided by a halfway point between the first side 804 and the second side 806 of the housing 802. In this way, additional securing of the information handling system device 814 on a side away from the rotational point of the information handling system device 814, as will be described later, is provided.

A second securing segment 826, configured as a tab, is included on a second side 820 of the information handling system device 814. The second securing segment 826 of the information handling system device 814 engages a second securing segment of the housing 802, such as the receptacle 812 described in FIG. 8A or the like. To provide efficient insertion and promote secure installation, rotational installation and removal of the device may be provided by the device retention assembly 850.

Figure 9A:
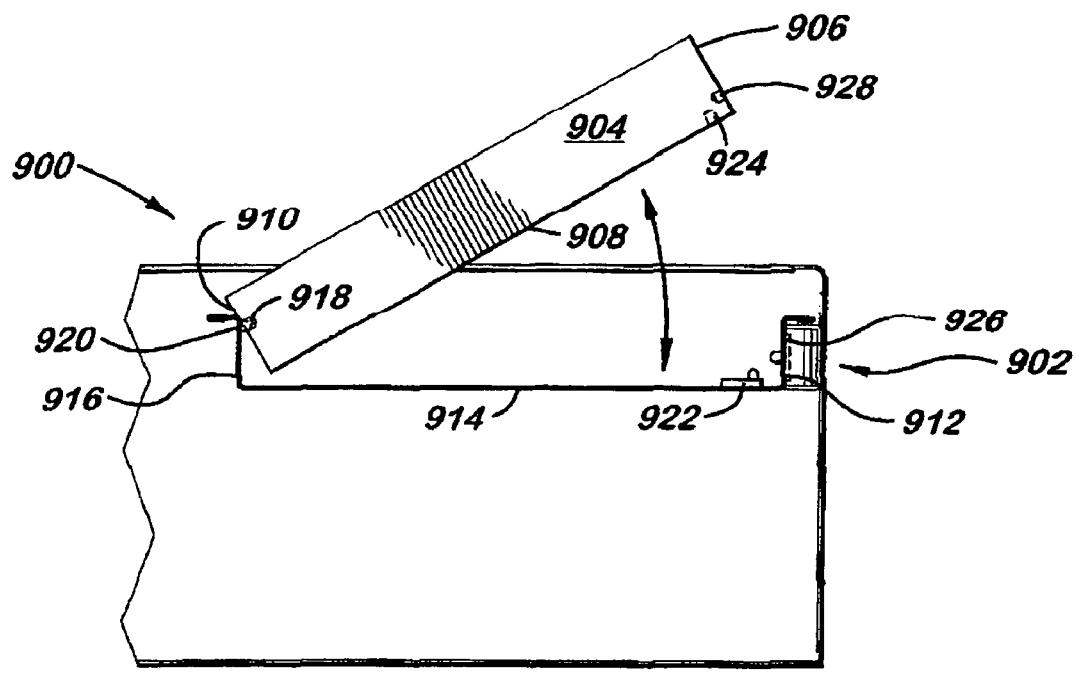
FIG. 9A is an end view of a device retention apparatus in accordance with an exemplary embodiment of the present invention, wherein an information handling system device is rotateably mounted to a housing.
Figure 9B:
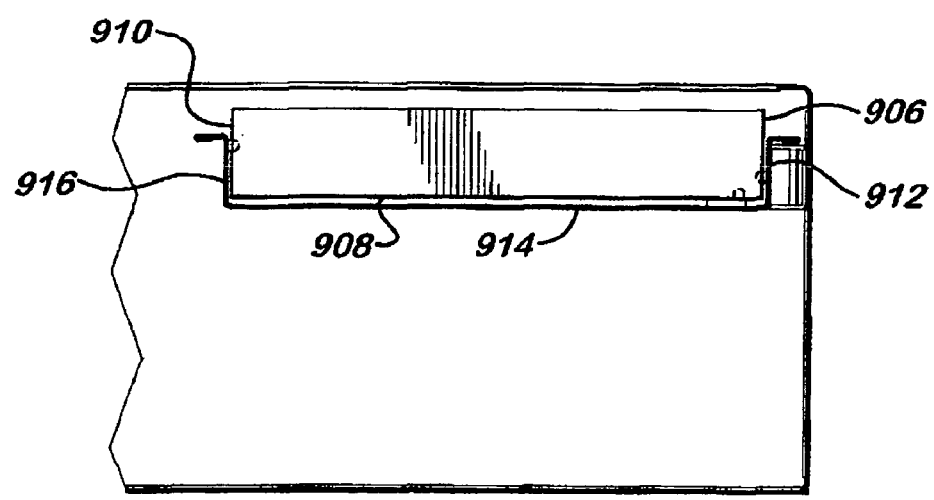
FIG. 9B is an end view of the device retention apparatus illustrated in FIG. 9A, wherein the information handling system device is mounted to the housing.

Referring now to FIGS. 9A and 9B, a device retention assembly 900 in accordance with an exemplary embodiment of the present invention is described. The device retention assembly 900 allows an information handling system device 904 to be installed by rotation into a housing 902 of an information handling system. In the present example described, top-mounting the information handling system device 904 into the housing 902 is described. It will be apparent to those of ordinary skill in the art that removal of the information handling system device 904 may be accomplished through rotation of a similar fashion in an opposite manner. The housing 902 is configured for receiving and securing the information handling system device 904. The information handling system device 904 includes a first device side 906, a second device side 910, and a third device side 908. The housing 902 includes a first housing side 912, a second housing side 916, and a third housing side 914.

A second device securing segment 918 included on the second device side 910 engages a second housing securing segment 920 on the second housing side 916. The device 904 is rotated about the engaged segments 918 and 920 so that a third housing securing segment 922 included on the third side 914 of the housing 902 engages a third device securing segment 924 on the third side 908 of the device 904. A first device securing segment 928 included on the first side 906 of the device may be engaged by a first housing securing segment 926 on the first side 912 of the housing 902. In this way, the first side 906, second side 910, and third side 908 of the information handling system device 904 may be secured against the first side 912, second side 916, and third side 914 of the housing 902, respectively, as illustrated in FIG. 9B, providing increased securing over previous methods and apparatus.

Figure 10A:
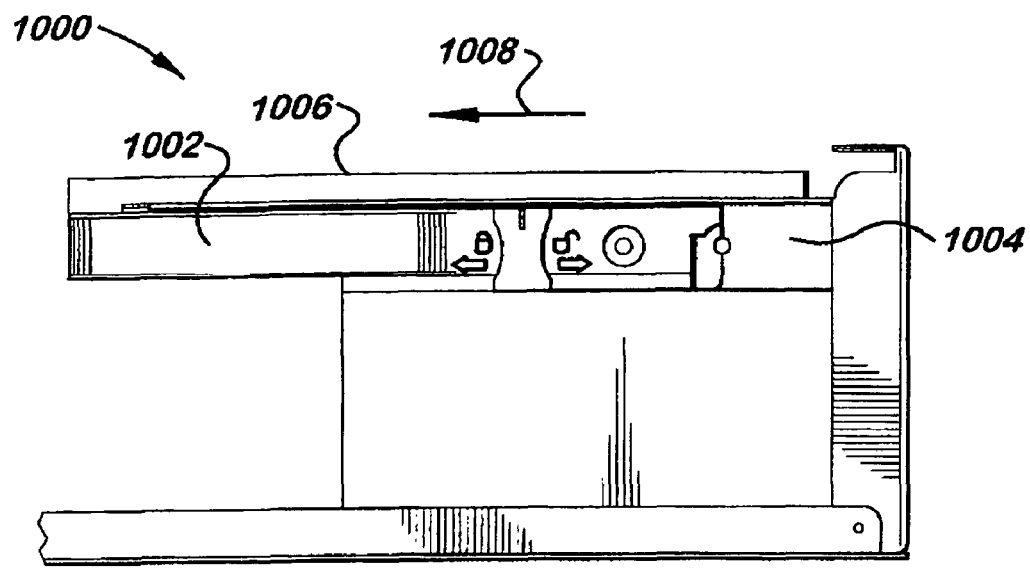
FIGS. 10A & 10B are side views of the device retention apparatus illustrated in FIG. 8A, wherein a selection mechanism is utilized.
Figure 10B:
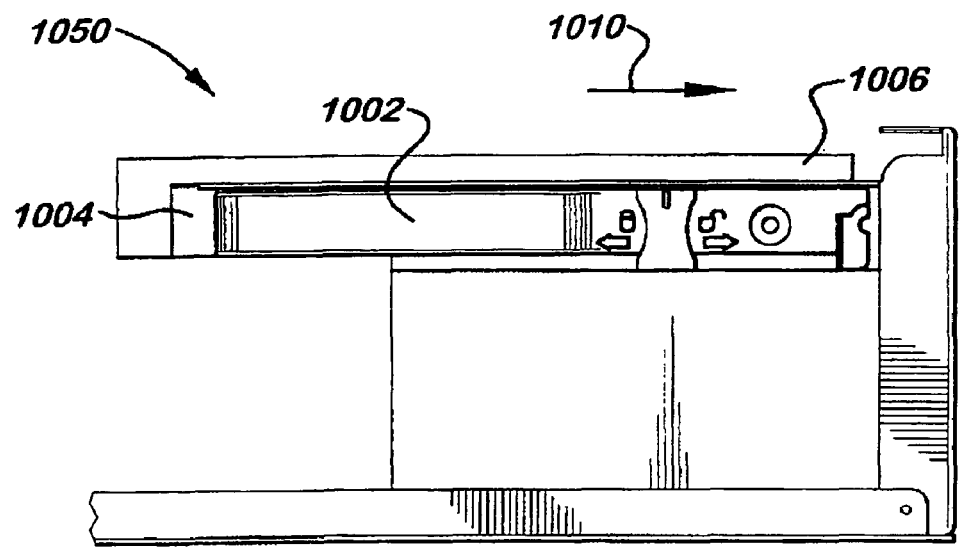

It may be preferable to include a selection mechanism 1002 on a first side of a housing 1004, as shown in embodiments 1000 and 1050 depicted in FIGS. 10A and 10B. The selection mechanism 1002 is slideably mounted to the housing 1004. To release an information handling system device 1006 from the housing 1004, the selection mechanism 1002 may be moved 1008 to a first position, disengaging the retaining portion 114 (FIG. 1) from the information handling system device 1006 and permitting removal of the information handling system device 1006 from the housing 1004.

To secure the information handling system device 1006 to the housing 1004, the selection mechanism 1002 may be moved 1010 to a second position, as shown in FIG. 10B, engaging the retaining portion 114 (FIG. 1) with the information handling system device 1006 and securing the information handling system device 1006 to the housing 1004.

Figure 11:
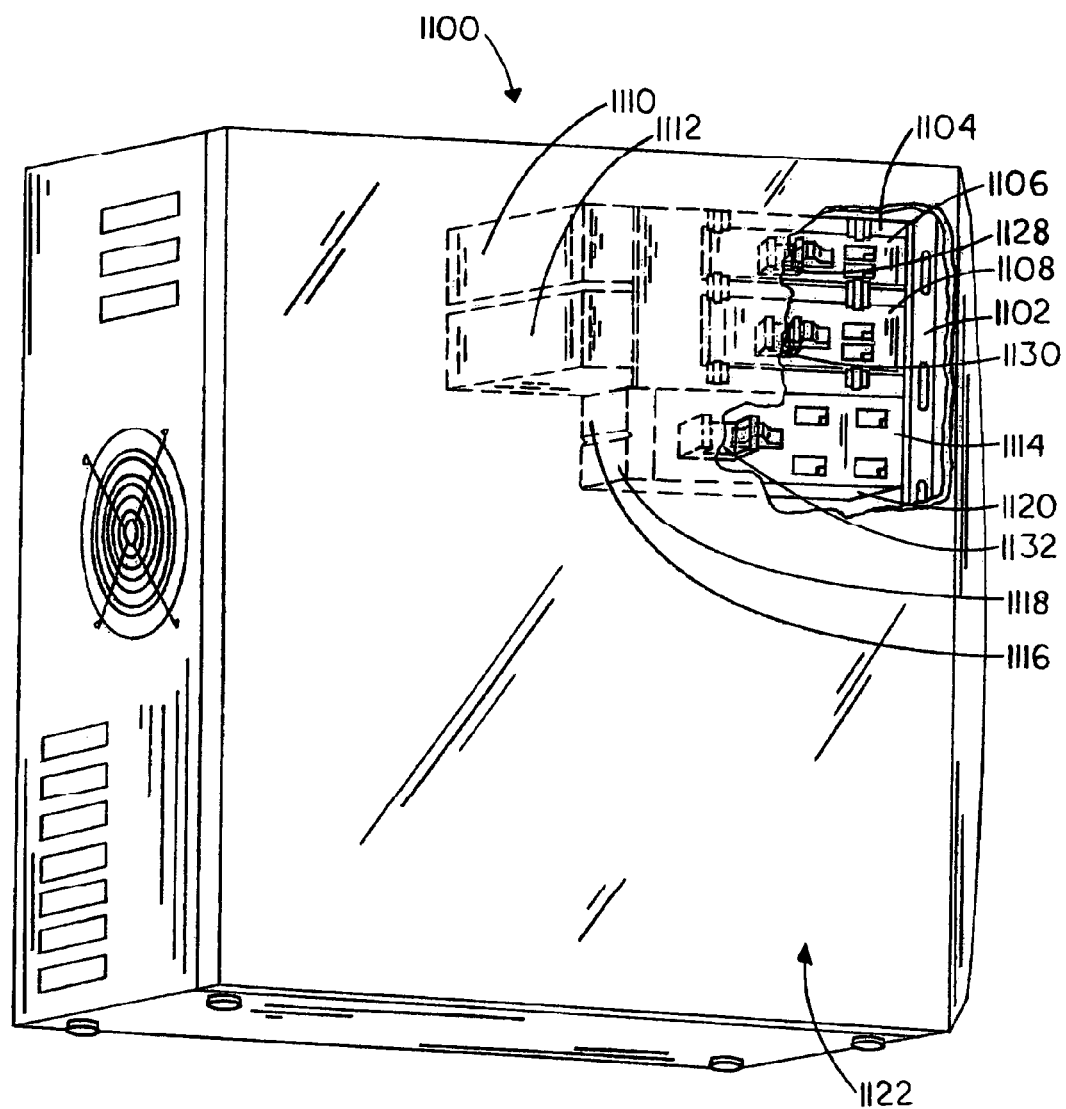
FIG. 11 is an isometric view illustrating an information handling system incorporating a device retention apparatus in accordance with an exemplary embodiment of the present invention, wherein the information handling system includes a locking ramp portion for engaging a selection mechanism of the device retention apparatus.
Figure 12:
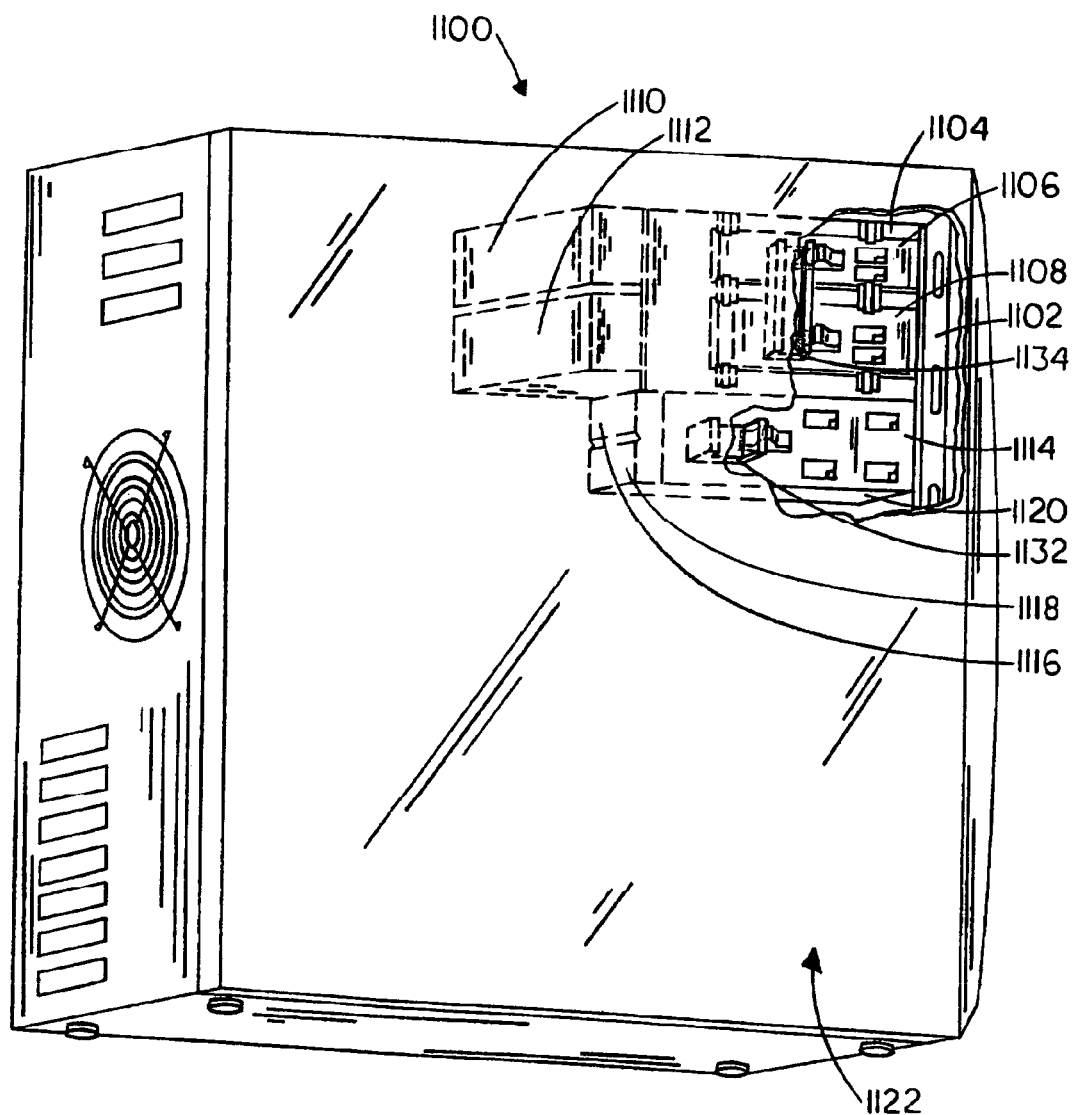
FIG. 12 is an isometric view of the information handling system illustrated in FIG. 11, wherein a locking ramp portion is included for engaging multiple selection mechanisms.
Figure 13:
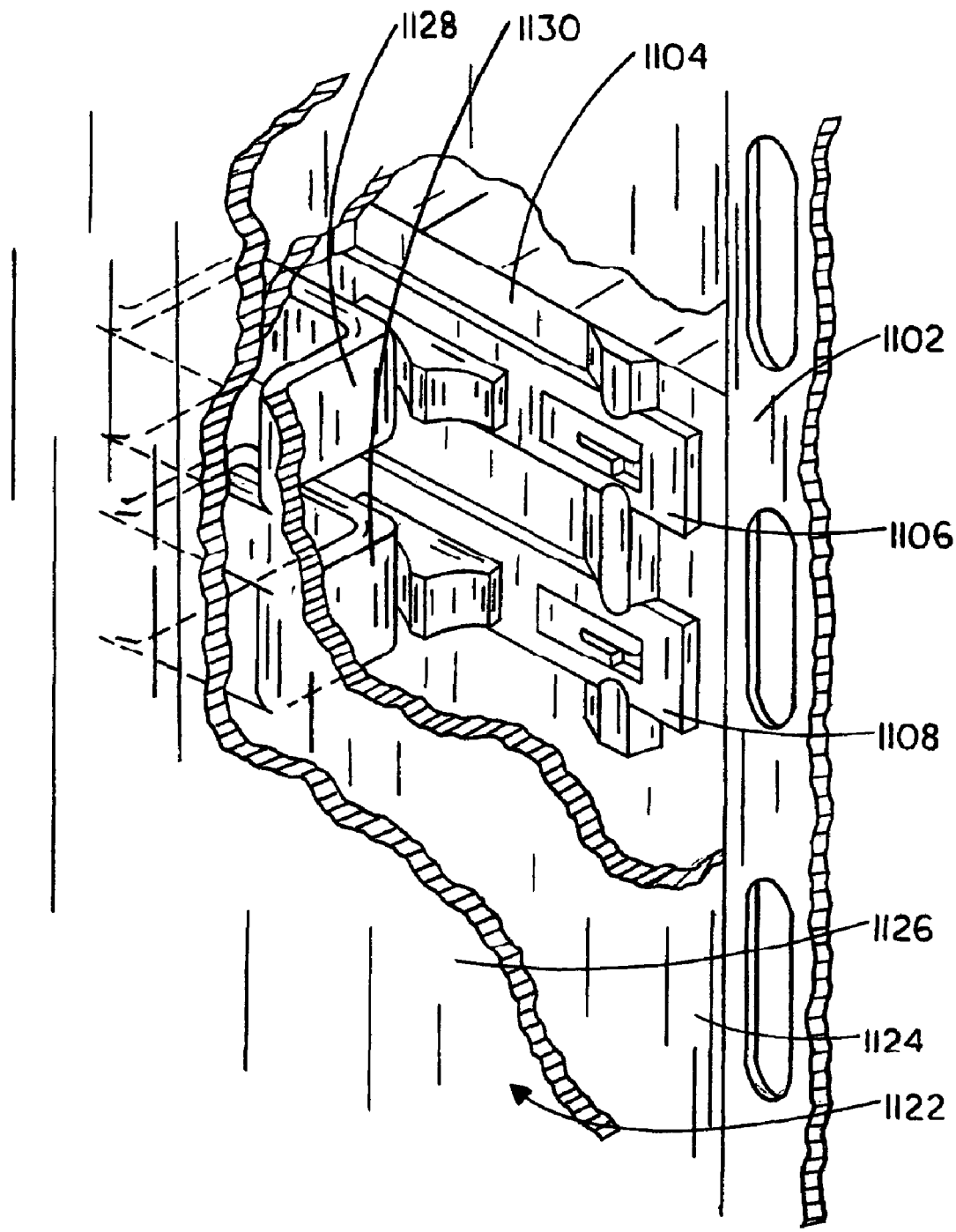
FIG. 13 is a partial cross-sectional isometric view of the information handling system illustrated in FIG. 11.

Referring now to FIGS. 11 through 13, a device retention apparatus in accordance with further exemplary embodiments of the present invention is described. An information handling system 1100 formed as a tower unit is illustrated in FIGS. 11 and 12. The information handling system 1100 includes a chassis 1102 for housing various components and devices, such as information handling system devices and the like, protecting the components and devices from environmental and other potentially harmful influences. A first device retention assembly 1104 includes a first selection mechanism 1106 and a second selection mechanism 1108 for securing information handling system devices 1110 and 1112, respectively. The first device retention apparatus 1104 is oriented in the chassis 1102 to enable insertion and removal of the information handling system devices 1110 and 1112 from the front of the chassis 1102. This orientation may be preferable for removable media devices, such as compact disc read-only memory (CD-ROM) drives, digital video disc (DVD) players, floppy disk drives, and the like, enabling a user to access the information handling system devices 1110 and 1112 when secured to the device retention assembly 1104. A third selection mechanism 1114 may also be formed to secure a plurality of devices 1116 and 1118 to a second device retention assembly 1120.

A door assembly 1122 is attached to the side of the chassis 1102 for enclosing the various components and devices, such as the information handling system devices 1110, 1112, 1116, 1118 and the like. The door assembly 1122 may include a metal liner 1124, a plastic skin 1126, and the like for protecting the various components and devices from environmental and other potentially harmful influences. In the embodiment illustrated in FIG. 13, the door assembly 1122 includes the metal liner 1124 adjacent to the interior of the chassis 1102 with the plastic skin 1126 surrounding the metal liner 1124; however, those of ordinary skill in the art will appreciate that many various combinations and configurations of materials may be included in the door assembly 1122. The metal liner 1124 includes a first locking ramp portion 1128 engaged with the first selection mechanism 1106, a second locking ramp portion 1130 engaged with the second selection mechanism 1108, and a third locking ramp portion 1132 engaged with the third selection mechanism 1114. As shown in FIG. 12, the first locking ramp portion 1128 and the second locking ramp portion 1130 may be formed as a single piece 1134 for ease of construction, assembly, or the like.

Preferably, the locking ramp portions 1128, 1130, 1132, and 1134 are aligned with the selection mechanisms 1106, 1108, and 1114 so that the door assembly 1122 may be fully closed only when the selection mechanisms 1106, 1008, and 1104 are in a position such as the first position 112 described in FIG. 1 or the like for securing the information handling system devices 1110, 1112, 1116, and 1118 to the first device retention assembly 1104 and the second device retention assembly 1120. Aligning the locking ramp portions 1128, 1130, 1132, and 1134 in such a manner may serve to secure the information handling system devices 1110, 1112, 1116, and 118 during shipping or the like, while additionally alerting an installation technician or the like to the security of the information system devices 1110, 1112, 1116, and 1118 within the chassis 1102.

While the locking ramp portions 1128, 1130, 1132, and 1134 are illustrated as an integral part of the metal liner 1124 in the exemplary embodiments shown (which may be preferable for reasons including ease of assembly, ease of manufacturing, or the like), those of ordinary skill in the art will appreciate that such locking ramp portions may be composed of a material formed or added to the door assembly 1122, the metal liner 1124, the plastic skin 1126, the chassis 1102, or the like. For example, a locking ramp may be a single piece of plastic, affixed to the metal liner 1124 with bolts, screws, or the like; alternately, a locking ramp portion may be formed as an integral part of the plastic skin 1126, formed to protrude through an aperture in the metal liner 1124.

In the exemplary embodiments illustrated in the accompanying figures, the locking ramp portions 1128, 1130, 1132, and 1134 are illustrated engaging selection mechanisms 1106, 1108, and 1114 located on the sides of the first device retention assembly 1104 and the second device retention assembly 1120. The sides of the first device retention assembly 1104 and the second device retention assembly 1120 are shown generally parallel with a side of the chassis 1102. It should be noted however, that locking ramp portions may be included for securing devices oriented in an internal portion of the chassis 1102; such devices may be oriented in a different manner from that previously described. For instance, a locking ramp may be provided for extending into the interior of the chassis 1102 and engaging a selection mechanism oriented generally parallel with a back portion of the information handling system 1100, such as the selection mechanism 522 illustrated in FIG. 5 or the like.

It is believed that the device retention apparatus of the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A device retention apparatus, comprising
   a housing for mounting an information handling system device;
   a retaining portion for engaging an information handling system device when the information handling system device is disposed in the housing;
   a selection mechanism for securing the information handling system device to the housing, the selection mechanism sliding between a first position and a second position; and
   a locking ramp for engaging the selection mechanism for holding the selection mechanism in the second position;
   wherein as the selection mechanism is moved from the first position to the second position, the selection mechanism engages the retaining portion with the information handling system device within the housing for securing the information handling system device within the housing.

2. The device retention apparatus as claimed in claim 1, wherein the retaining portion is formed as an integral part of the housing.

3. The device retention apparatus as claimed in claim 1, wherein the retaining portion includes a retaining tab for engaging a hole disposed in the information handling system device.

4. The device retention apparatus as claimed in claim 1, further comprising when the selection mechanism is moved from the second position to the first position, the selection mechanism disengages the retaining portion from the information handling system device for permitting removal of the information handling system device from the housing.

5. The device retention apparatus as claimed in claim 4, wherein when the selection mechanism is moved to the second position, the retention portion is withdrawn thereby permitting at least one of insertion and removal of the information handling system device without interference from the retention portion.

6. The device retention apparatus as claimed in claim 1, wherein the housing includes a first side and a second side disposed on generally opposing sections of the housing, the second side including a biasing mechanism for the information handling system device against the first side of the housing, and the first side including the selection mechanism.

7. The device retention apparatus as claimed in claim 1, wherein the selection mechanism includes a handle so as to enable manual operation of the retention mechanism, the handle facilitating at least one of operation from the front of the housing and operation from the side of the housing.

8. The device retention apparatus as claimed in claim 1, wherein the selection mechanism provides at least one of an indication of an unsecured state wherein the retaining portion is not engaged with the information handling system device and an indication of a secured state wherein the retaining portion is engaged with the information handling system device.

9. A device retention apparatus, comprising
   a housing for mounting an information handling system device;
   means for engaging an information handling system device when the information handling system device is disposed in the housing;
   means for securing the information handling system device to the housing, the securing means sliding between a first position and a second position; and
   means for holding the securing means in the second position;
   wherein as the securing means is moved from the first position to the second position, the securing means engages the engaging means with the information handling system device within the housing for securing the information handling system device within the housing.

10. The device retention apparatus as claimed in claim 9, wherein the engaging means includes means for engaging a hole disposed in the information handling system device.

11. The device retention apparatus as claimed in claim 9, further comprising when the securing means is moved from the second position to the first position, the securing means disengages the engaging means from the information handling system device for permitting removal of the information handling system device from the housing.

12. The device retention apparatus as claimed in claim 11, wherein when the securing means is moved to the second position, the retention portion is withdrawn thereby permitting at least one of insertion and removal of the information handling system device without interference from the engaging means.

13. The device retention apparatus as claimed in claim 9, wherein the housing includes a first side and a second side disposed on generally opposing sections of the housing, the second side including a biasing mechanism for the information handling system device against the first side of the housing, and the first side including the securing means.

14. The device retention apparatus as claimed in claim 9, wherein the securing means includes a handle so as to enable manual operation of the retention mechanism, the handle facilitating at least one of operation from the front of the housing and operation from the side of the housing.

15. The device retention apparatus as claimed in claim 9, wherein the securing means provides at least one of an indication of an unsecured state wherein the engaging means is not engaged with the information handling system device and an indication of a secured state wherein the engaging means is engaged with the information handling system device.

16. An information handling system, comprising:
a chassis for holding components of the information handling system, the chassis having an opening being at least substantially enclosed by a door for providing access to the components; and
a device retention apparatus disposed in the chassis for mounting an information handling system device within the chassis,
the device retention apparatus including:
a housing for receiving the information handling system device;
a retaining portion for engaging an information handling system device when the information handling system device is disposed in the housing;
a selection mechanism coupled to the housing for securing the information handling system device to the housing, the selection mechanism sliding between a first position and a second position; and
a locking ramp coupled to the door for engaging the selection mechanism for holding the selection mechanism in the second position;
wherein as the selection mechanism is moved from the first position to the second position, the selection mechanism engages the retaining portion with the information handling system device within the housing for securing the information handling system device within the housing.

17. The information handling system as claimed in claim 16, wherein the retaining portion is formed as an integral part of the housing.

18. The information handling system as claimed in claim 16, wherein the retaining portion includes a retaining tab for engaging a hole disposed in the information handling system device.

19. The information handling system as claimed in claim 16, further comprising when the selection mechanism is moved from the second position to the first position, the selection mechanism disengages the retaining portion from the information handling system device for permitting removal of the information handling system device from the housing.

20. The information handling system as claimed in claim 19, wherein when the selection mechanism is moved to the second position, the retention portion is withdrawn thereby permitting at least one of insertion and removal of the information handling system device without interference from the retention portion.

21. The information handling system as claimed in claim 16, wherein the housing includes a first side and a second side disposed on generally opposing sections of the housing, the second side including a biasing mechanism for the information handling system device against the first side of the housing, and the first side including the selection mechanism.

22. The information handling system as claimed in claim 16, wherein the selection mechanism includes a handle so as to enable manual operation of the retention mechanism, the handle facilitating at least one of operation from the front of the housing and operation from the side of the housing.

23. The information handling system as claimed in claim 16, wherein the selection mechanism provides at least one of an indication of an unsecured state wherein the retaining portion is not engaged with the information handling system device and an indication of a secured state wherein the retaining portion is engaged with the information handling system device.

* * * * *